(12) United States Patent
Obata

(10) Patent No.: US 9,063,173 B2
(45) Date of Patent: Jun. 23, 2015

(54) IRIDIUM ALLOY EXCELLENT IN HARDNESS, WORKABILITY AND ANTI-CONTAMINATION PROPERTIES

(75) Inventor: Tomokazu Obata, Isehara (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 930 days.

(21) Appl. No.: 12/675,390

(22) PCT Filed: Nov. 17, 2008

(86) PCT No.: PCT/JP2008/070839
§ 371 (c)(1),
(2), (4) Date: Feb. 25, 2010

(87) PCT Pub. No.: WO2009/107289
PCT Pub. Date: Sep. 3, 2009

(65) Prior Publication Data
US 2010/0239453 A1 Sep. 23, 2010

(30) Foreign Application Priority Data
Feb. 27, 2008 (JP) ................. P2008-045573

(51) Int. Cl.
*C22C 5/04* (2006.01)
*C21D 9/00* (2006.01)
*C21D 1/00* (2006.01)
*C22F 1/14* (2006.01)
*G01R 1/067* (2006.01)
*B21C 1/00* (2006.01)
*G01R 3/00* (2006.01)

(52) U.S. Cl.
CPC ............ *G01R 1/06755* (2013.01); *B21C 1/003* (2013.01); *C22C 5/04* (2013.01); *C22F 1/14* (2013.01); *G01R 3/00* (2013.01)

(58) Field of Classification Search
None
See application file for complete search history.

(56) References Cited

U.S. PATENT DOCUMENTS

| 3,918,965 | A | * | 11/1975 | Inouye et al. | ................. 420/461 |
| 6,812,723 | B2 | * | 11/2004 | Mikami | ................. 324/754.07 |
| 2006/0165554 | A1 | * | 7/2006 | Coupland et al. | ............. 420/461 |
| 2006/0197542 | A1 | * | 9/2006 | Tanaka | ......................... 324/754 |

FOREIGN PATENT DOCUMENTS

| JP | 1-180964 | 7/1989 |
| JP | 4-323339 | 11/1992 |

(Continued)

OTHER PUBLICATIONS eHow, What Are Noble Metals?, Nov. 2010 (http://www.ehow.com/facts_7433121_noble-metals_.html).*

(Continued)

*Primary Examiner* — Yoshitoshi Takeuchi
(74) *Attorney, Agent, or Firm* — Roberts & Roberts, LLP

(57) ABSTRACT

The present invention provides an iridium alloy suitable for a wire rod for probe pins, with zirconium as an additive element contained as an essential element and with aluminum and/or copper further added. In this iridium alloy, the additive concentration of zirconium is 100 to 500 ppm and the total additive concentration of aluminum and copper is 10 to 500 ppm. The present invention will be able to meet such requirements placed on a material for probe pins as that further miniaturization thereof would be demanded in the future and that use environment thereof becomes severe.

9 Claims, 2 Drawing Sheets

(56) References Cited

FOREIGN PATENT DOCUMENTS

| JP | 05-154719 | | 6/1993 | | |
|---|---|---|---|---|---|
| JP | 10-038922 | | 2/1998 | | |
| JP | 2004-093355 | | 3/2004 | | |
| JP | 2005-233967 | | 9/2005 | | |
| JP | 2005-533924 | | 11/2005 | | |
| JP | 2007-218850 | | 8/2007 | | |
| JP | 2007-225288 | | 9/2007 | | |
| JP | 2007-225288 | * | 9/2012 | ............. | G01R 1/067 |

OTHER PUBLICATIONS

Vilca J.M., "Removal of Impurities From Platinum Group Metals by Electron Beam Melting." Proceeding of the Conference on Electron Beam Melting and Refining—State of the Art, 2000, vol. 2000, p. 158-173.

Ter-Oganesyants A K, "Production of Refined Iridium From Concentrate KP-3.", Russian Journal of Non-Ferrous Metals, vol. 41 No. 6, 2000, p. 34-37.

* cited by examiner

IRIDIUM ALLOY EXCELLENT IN HARDNESS, WORKABILITY AND ANTI-CONTAMINATION PROPERTIES

TECHNICAL FIELD

The present invention relates to an iridium alloy suitable for a wire rod constituting a probe pin for inspecting the electrical properties of a semiconductor integrated circuit and the like, and a manufacturing method of the iridium alloy.

BACKGROUND ART

An inspection of the electrical properties of a semiconductor integrated circuit and the like is carried out by bringing probe pins into contact with a large number of electrode pads of the semiconductor integrated circuit and the like. Constituent materials for probe pins are required to have hardness for ensuring wear resistance against inspection which is repeatedly carried out millions of times, oxidation resistance for suppressing the contamination of objects to be inspected by the formation of oxide films, and other properties, such as low specific resistance for improving signal delays. Examples of conventional materials for probe pins include materials in which beryllium-copper (Be—Cu), phosphor bronze (Cu—Sn—P) and tungsten (W) are used, and materials in which alloys obtained by adding silver (Ag) to palladium (Pd) are used.

Patent Document 1: JP Patent Application Laid-Open No. 10-038922
Patent Document 2: JP Patent Application Laid-Open No. 05-154719
Patent Document 3: JP Patent Application Laid-Open No. 2004-093355

The above-described conventional materials do not provide all of the required properties. That is, copper alloys and tungsten are materials which are oxidized relatively easily although their mechanical properties are sufficient. On the other hand, palladium alloys are somewhat inferior in hardness and the like although they have good oxidation resistance.

Hence, iridium is attracting attention as a new constituent material for probe pins. Since iridium is a metal excellent in oxidation resistance, electrical properties and current resistance and is also adequate in terms of hardness, this metal is suitable as a material for probe pins which are subjected to repeated contact.

DISCLOSURE OF THE INVENTION

Problems to be Solved by the Invention

However, iridium has some inadequate points for meeting the properties which are required of probe pins in the future. For example, in recent semiconductor integrated circuits and the like, the trend is toward narrower pitches between electrode pads due to high density designs and, therefore, it is required that the wire diameter of probe pins be made fine. In this respect, iridium has high hardness and it is difficult to design fine wires. Therefore, wires are often broken during working and hence it is difficult to meet this requirement.

In addition to the above-described high density designs, probe pins are required to adapt to an increase in the inspection speed of circuits. However, an increase in the inspection speed increases loads due to friction and it is feared that a decrease in strength might be caused by heat generation due to increased loads. This problem can occur also in iridium, and an improvement in mechanical properties at high temperatures is required.

The present invention has been made against a background of such circumstances, and the invention provides a material for probe pins of which further miniaturization is required in the future, whose use environment becomes severe, and which can meet these requirements.

Means for Solving the Problems

To solve the above-described problems, the present inventors earnestly conducted research and examined the possibility of an improvement in workability and the like by the addition of trace amounts of additive elements to pure iridium, which is the above-described conventional material. The present inventors found out from the examination that a wire rod for probe pins obtains desirable properties by combined addition of zirconium, aluminum and copper.

That is, the present invention provides an iridium alloy suitable for a wire rod for probe pins, with zirconium as an additive element contained as an essential element and with aluminum and/or copper further added. In this iridium alloy, the additive concentration of zirconium is 100 to 500 ppm and the total additive concentration of aluminum and copper is 10 to 500 ppm.

The addition of trace amounts of these additive elements contributes to refining the crystal grains of an iridium material, thereby increasing workability and high-temperature strength. As a result of this, inherent workability is improved compared to pure iridium and working at high temperatures becomes easy. As a result of this, a material according to the present invention permits working into 0.05-mm to 0.5-mm ultrafine wires, and can adapt to high density designs of probe pins. Furthermore, an increase in high-temperature strength leads to an increase in hardness, and the surface hardness of the material shows not less than 700 Hv in a condition immediately after working. Thus the material can maintain a surface hardness value of not less than 600 Hv even if subjected to 1000° C. heat treatment. Even when the temperature of the material becomes high due to a temperature rise caused by repeated contact, the material can maintain stable contact properties.

As described above, additive elements added to iridium are combinations of zirconium, aluminum and copper. In this respect, although a certain level of effect occurs even when zirconium alone is used as an additive element, in the present invention at least either aluminum or copper is added for a further improvement of properties. The reason why zirconium is desirable as an essential additive element is that zirconium, which has the action of raising the recrystallization temperature of iridium in addition to the refinement of crystal grains, is suitable for an increase in high-temperature strength and for ensuring workability at high temperatures.

In the present invention which involves adding at least either aluminum or copper while using zirconium as an essential additive element, the zirconium concentration is limited to 100 to 500 ppm, and the aluminum concentration and the copper concentration are limited to 10 to 500 ppm (a total concentration of both aluminum and copper). Note that, as a phrase "at least either aluminum or copper" is used, either one or both of aluminum and copper are added.

The lower limit of each of the above-described additive elements is a minimum additive amount for ensuring a remarkable workability improving effect. On the other hand, the reason why the upper limit of a total additive amount of the additive elements (zirconium, aluminum, copper) is limited to 1000 ppm is that if 1000 ppm is exceeded, workability worsens, with the result that a wire breakage may occur during fine-wire working and besides even when fine wire designs are accomplished, cracks and the like may occur during working thereafter. This is also because excessive addition of the additive elements increases specific resistance, thereby worsening electrical properties. A more preferred upper limit of a total additive amount of the additive elements is 600 ppm and a still further preferred upper limit is 400 ppm.

An iridium alloy suitable for a wire rod for probe pins related to the present invention is manufactured by manufacturing an ingot and a bar composed of an iridium alloy having a prescribed composition to which zirconium, aluminum and copper are added and subjecting the ingot and bar to wire rod working. Concretely, a manufacturing method composed of the following steps is preferable.

(a) A step of casting an alloy consisting of additive elements consisting of zirconium and aluminum and/or copper and the balance iridium, and making a bar from a casting.

(b) A step of forming a wire rod having a wire diameter of 0.5 to 1.0 mm by hot-working the bar.

(c) A step of subjecting the wire rod, at least once, to a combination of annealing at 1000 to 1200° C. and wire drawing of not less than one pass under heat by electric current application.

(d) A step of subjecting the wire rod after wire drawing under heat by electric current application, at least once, to a combination of annealing at 900 to 1200° C. and cold wire drawing of not less than one pass.

In the above-described manufacturing process, the casting of an alloy and the forging of a casting into a bar as well as the drawing of the bar into wire rods having wire diameters of 0.5 to 1.0 mm (hereinafter referred to as rough-worked wire rods) can be performed by publicly known methods. In the present invention, the working of rough-worked wire rods is performed by combining wire drawing under heat by electric current application and cold working, whereby the rough-worked wire rods are worked into wire rods of not more than 0.5 mm while ensuring material hardness and suppressing the occurrence of defects. Working methods according to the present invention is described in detail below.

In the casting of an alloy, high-energy-density casting methods, such as arc melting and high-frequency melting, are applied because iridium has a high melting point. The zirconium concentration is adjusted during casting and, either powdery or nubbly raw materials can be used at this time. Hot forging and hot rolling are applied for working an ingot after alloy casting into a bar, and may be performed repeatedly. As a rough standard for working sizes in this step, a bar whose section has a rectangular shape of about 3 to 10 mm square is desirable (the foregoing is a description of the step (a)).

In the working in the step of working the bar into rough-worked wire rods (the step (b)), after the annealing of the bar, the bar is hot-worked into wire rods having wire diameters of 0.5 to 1.0 mm. The annealing temperature is 1100° C. to 1300° C., and it is preferred that annealing be performed in a non-oxidizing gas atmosphere. Swaging and draw bench working are preferable as hot working, and a combination of swaging and draw bench working is more preferable. At this time, it is possible to perform each working in multiple passes. In this step, annealing may be performed multiple times. For example, swaging and draw bench working are performed after annealing, and draw bench working is performed after annealing has been performed again, whereby enabling wire rods to have the desired wire diameters.

The wire drawing under heat by electric current application performed at the step (c), is wire drawing which involves causing a wire rod being worked to pass through a die and pressure rollers. Electric current is applied to the wire rod being worked from outside and the resistance heat generated on that occasion is used as a heat source for ensuring workability. In wire drawing under heat by electric current application, high-temperature and uniform heating is made possible by adjusting the current to be applied, and a zirconium-containing iridium alloy having high high-temperature strength can be relatively easily worked.

As the condition for the wire drawing by electric current application performed in the present invention, it is preferred that the applied current be 8.0 to 12.0 mA. It is also preferred that a die be used as a working member, and the reduction ratio is set according to the hole diameter of the die. It is preferred that the reduction ratio per pass be set at 15 to 20%. In this wire drawing, it is preferred that a lubricant for lessening the fraction between the die and the wire rod to be worked be used. However, it is preferred that a carbon powder be used as a lubricant for suppressing the occurrence of wire breakages and defects.

Before the wire drawing under heat by electric current application, annealing at 1000 to 1200° C. is necessary in order to ensure workability. When a combination of annealing and working of not less than one pass is regarded as one set, treatment for the working is performed in not less than one set. A rough standard for the wire diameters achieved in this step of wire drawing under heat by electric current application is 0.2 to 0.8 mm, and it is preferred that the rough standard be 0.2 to 0.3 mm particularly when ultrafine wires of not more than 0.15 mm are finally manufactured.

The cold wire drawing step (the step (d)) is performed to finally adjust the wire diameter and to impart strength to the wire rod by cold working. In this wire drawing, it is preferred that the reduction ratio per pass be set at 4 to 10%. In this cold wire drawing, it is preferred that rapeseed oil be used as a lubricant. Note that, also before this wire drawing, it is necessary to perform annealing at 900 to 1200° C. in order to ensure workability. The above-described cold wire drawing allows the material to be worked into wire rods having wire diameters of 0.05 to 0.5 mm.

BEST MODE FOR CARRYING OUT THE INVENTION

A preferred embodiment of the present invention is described below. In this embodiment, iridium alloys in which the additive amounts of zirconium, aluminum and copper were appropriately changed were manufactured, and an investigation was made as to whether these iridium alloys can be worked into wire rods.

Figure 1:
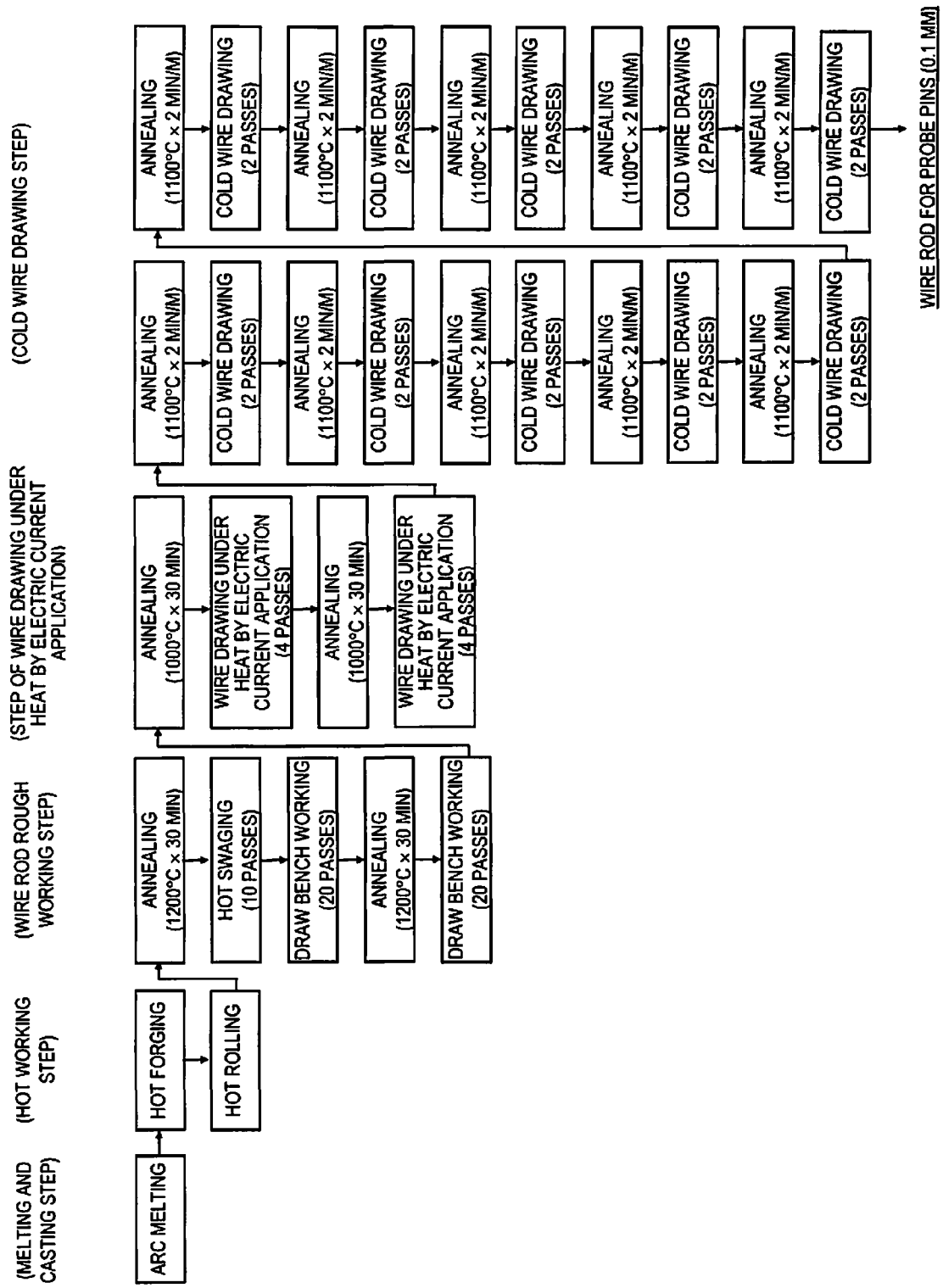
FIG. 1 is a diagram to explain the manufacturing process of a wire rod for probe pins according to a first embodiment.

FIG. 1 shows the manufacturing process of a wire rod for probe pins in this embodiment. This manufacturing process is broadly divided into a melting (casting) step, a hot working step, a wire rod rough working step, a step of wire drawing under heat by electric current application, and a cold wire drawing step. Each step will be described below.

<Melting step>: A pure iridium powder and powders of additive elements (zirconium, aluminum, copper) were weighed and mixed to obtain a prescribed composition, and a bar-like iridium alloy ingot was manufactured by arc melting the mixture.

<Hot working step>: The above-described bar-like ingot was hot forged at 1400° C., and a bar of 8 mm square was obtained. Hot rolling was performed (temperature 1400° C.) by using grooved rolling mill rolls and a wire rod of 5 mm square was obtained.

<Wire rod rough working step>: Before the working, annealing was performed at 1200° C. for 30 minutes in a nitrogen atmosphere, and hot swaging and draw bench working were performed. In the hot swaging, the wire rod was caused to pass through a swager while being heated, and the wire rod was reduced to a wire diameter of 3.04 mm by repeating this swaging in 10 passes. Next, this wire rod was worked by use of a draw bench while being heated by means of a burner, and the wire rod was reduced to a wire diameter of 1.90 mm by performing the draw bench working in 20 passes. Then, annealing was performed again, draw bench working was performed in 20 passes, and a rough-worked wire rod having a wire diameter of 0.51 mm was obtained.

<Step of wire drawing under heat by electric current application>: The rough-worked wire rod worked through these steps was subjected to wire drawing by use of a device for wire drawing under heat by electric current application. In this device for wire drawing under heat by electric current application, the rough-worked wire rod is drawn by being caused to pass through a die while being fed from feeding rolls. In the heating by electric current application at this time, electric current is applied by using the feeding rolls and the die as electrodes and the rough-worked wire rod is heated by electric current application. Note that, the die is individually heated. The working conditions adopted in this embodiment were as follows: electric current of 9.5 mA and feeding rate of 2.72 m/min. Immediately after the feeding rollers, a carbon powder was applied to the wire rod.

Before the wire drawing under heat by electric current application, annealing was performed at 1100° C. for 30 minutes in a nitrogen atmosphere. Wire drawing was performed in 4 passes under the above-described conditions. This combination of annealing and wire drawing under heat by electric current application was performed twice and a wire rod having a wire diameter of 0.27 mm was obtained.

<Cold wire drawing step>: Annealing was performed at 1100° C. for 30 minutes in a nitrogen atmosphere and cold wire drawing was performed. This combination of heat treatment and cold wire drawing was performed 10 times and finally a wire rod having a wire diameter of 0.1 mm was obtained.

In this embodiment, in the above-described manufacturing process, the number of wire breakages during working for obtaining one lot (total length: 300 m) of wire rods (wire diameter: 0.1 mm) was recorded. The bending test was conducted for the manufactured wire rods. In this bending test, wire rods are bent 90° and unbent until they were broken and the number of bends performed until breakage occurs is measured. Furthermore, for the manufactured wire rods, heat treatment was performed immediately after the manufacture and at 1000° C. for 30 minutes and the surface hardness after the heat treatment was measured with a Vickers hardness meter. The results of these investigations are shown in Tables 1 to 4.

TABLE 1

| | Concentration of additive elements (ppm) | | | Evaluation of workability*[1] | | Evaluation of hardness | |
|---|---|---|---|---|---|---|---|
| | Al | Cu | Zr | Number of wire breakages | Number of bends | After manufacture | After heat treatment |
| Reference example 1 | 1 | — | — | 2 | 4 | 720 | 643 |
| Reference example 2 | 10 | — | — | 1 | 5 | 740 | 641 |
| Reference example 3 | 100 | — | — | 0 | 6 | 783 | 703 |
| Reference example 4 | 1000 | — | — | 1 | 7 | 807 | 734 |
| Reference example 5 | — | 1 | — | 2 | 4 | 700 | 617 |
| Reference example 6 | — | 10 | — | 1 | 5 | 750 | 654 |
| Reference example 7 | — | 100 | — | 1 | 6 | 772 | 700 |
| Reference example 8 | — | 1000 | — | 0 | 7 | 810 | 725 |
| Reference example 9 | — | — | 1 | 1 | 5 | 740 | 651 |
| Reference example 10 | — | — | 10 | 0 | 5 | 765 | 701 |
| Reference example 11 | — | — | 100 | 0 | 7 | 790 | 727 |
| Reference example 12 | — | — | 1000 | 0 | 7 | 837 | 740 |

*Al, Cu and Zr were singly added
*[1]Evaluation of workability:
Number of wire breakages = Number of wire breakages that occurred during wire rod working
Number of bends = Number of bends performed until the breakage of a manufactured wire rod occurred

TABLE 2

| | Concentration of additive elements (ppm) | | | Evaluation of workability*1 | | Evaluation of hardness | |
|---|---|---|---|---|---|---|---|
| | Al | Cu | Zr | Number of wire breakages | Number of bends | After manufacture | After heat treatment |
| Embodiment 1 | 10 | — | 100 | 0 | 8 | 745 | 685 |
| Embodiment 2 | 100 | — | 100 | 0 | 8 | 761 | 690 |
| Embodiment 3 | — | 10 | 100 | 0 | 7 | 741 | 687 |
| Embodiment 4 | — | 100 | 100 | 0 | 7 | 798 | 705 |
| Embodiment 5 | 100 | — | 300 | 0 | 8 | 820 | 744 |
| Embodiment 6 | — | 300 | 100 | 0 | 8 | 833 | 750 |
| Reference example 13 | 10 | — | 10 | 1 | 5 | 731 | 642 |
| Reference example 14 | — | 10 | 10 | 2 | 5 | 725 | 638 |
| Reference example 15 | 10 | 10 | — | 1 | 5 | 740 | 641 |
| Reference example 16 | 100 | 100 | — | 0 | 8 | 755 | 672 |

*Two elements were selected from Al, Cu and Zr and added

*1Evaluation of workability:

Number of wire breakages = Number of wire breakages that occurred during wire rod working Number of bends = Number of bends performed until the breakage of a manufactured wire rod occurred

TABLE 3

| | Concentration of additive elements (ppm) | | | Evaluation of workability*1 | | Evaluation of hardness | |
|---|---|---|---|---|---|---|---|
| | Al | Cu | Zr | Number of wire breakages | Number of bends | After manufacture | After heat treatment |
| Embodiment 5 | 10 | 10 | 100 | 0 | 7 | 779 | 715 |
| Embodiment 6 | 100 | 100 | 100 | 0 | 7 | 784 | 721 |
| Embodiment 7 | 30 | 10 | 280 | 0 | 8 | 810 | 725 |
| Embodiment 8 | 35 | 40 | 300 | 0 | 9 | 830 | 730 |
| Embodiment 9 | 45 | 25 | 330 | 0 | 8 | 826 | 744 |
| Embodiment 10 | 65 | 39 | 275 | 0 | 9 | 822 | 711 |
| Embodiment 11 | 84 | 40 | 235 | 0 | 8 | 811 | 709 |
| Embodiment 12 | 68 | 23 | 250 | 0 | 9 | 820 | 711 |
| Embodiment 13 | 79 | 26 | 255 | 0 | 9 | 813 | 711 |
| Embodiment 14 | 89 | 35 | 230 | 0 | 9 | 819 | 708 |
| Embodiment 15 | 83 | 38 | 275 | 0 | 10 | 820 | 720 |
| Embodiment 16 | 85 | 42 | 225 | 0 | 9 | 807 | 706 |
| Embodiment 17 | 88 | 42 | 220 | 0 | 9 | 807 | 705 |
| Embodiment 18 | 99 | 28 | 210 | 0 | 9 | 805 | 701 |
| Embodiment 19 | 105 | 40 | 240 | 0 | 9 | 818 | 718 |
| Embodiment 20 | 117 | 38 | 255 | 0 | 9 | 825 | 722 |
| Embodiment 21 | 125 | 31 | 205 | 0 | 9 | 814 | 709 |
| Reference example 17 | 10 | 10 | 10 | 0 | 5 | 755 | 680 |
| Reference example 18 | 55 | 20 | 25 | 0 | 8 | 770 | 660 |
| Reference example 19 | 60 | 10 | 30 | 0 | 9 | 778 | 680 |
| Reference example 20 | 60 | 15 | 25 | 0 | 8 | 776 | 682 |

*The three elements of Al, Cu and Zr were added

*1Evaluation of workability:

Number of wire breakages = Number of wire breakages that occurred during wire rod working Number of bends = Number of bends performed until the breakage of a manufactured wire rod occurred

TABLE 4

| | Concentration of additive elements (ppm) | | | Evaluation of workability*[1] | | Evaluation of hardness | |
|---|---|---|---|---|---|---|---|
| | Al | Cu | Zr | Number of wire breakages | Number of bends | After manufacture | After heat treatment |
| Comparative example 1 | 0.5 | — | — | 8 | 2 | 660 | 298 |
| Comparative example 2 | — | 0.5 | — | 7 | 2 | 663 | 303 |
| Comparative example 3 | — | — | 0.5 | 9 | 2 | 680 | 310 |
| Comparative example 4 | 1200 | — | — | 8 | 3 | 822 | 733 |
| Comparative example 5 | — | 1200 | — | 8 | 3 | 812 | 735 |
| Comparative example 6 | — | — | 1200 | 9 | 3 | 840 | 763 |

*The additive concentrations of Al, Cu and Zr were outside the appropriate ranges.
*[1]Evaluation of workability:
Number of wire breakages = Number of wire breakages that occurred during wire rod working
Number of bends = Number of bends performed until the breakage of a manufactured wire rod occurred It is confirmable from the results of Tables 1 to 3 that in iridium to which any one of zirconium, aluminum and copper was added, for example, as in reference examples 1 to 12, the breakage during working occurs less and that the iridium is strong in the resistance against bending even after the working into the wire rods. The hardness of the iridium exceeds 700 Hv immediately after the working and maintains not less than 600 Hv even after the heat treatment at 1000° C. Therefore, it can be ascertained that adding these additive elements singly is effective in improving workability and strength.

It is recognizable that iridium alloys obtained by combined addition of not less than 100 ppm of zirconium as an essential element and not less than 10 ppm of at least either aluminum or copper, which are embodiments of the present invention, have properties exceeding those of the iridium alloys of these reference examples and are excellent (Tables 2 and 3). However, it is recognizable that this effect decreases in iridium alloys in which the additive amounts are lower than the lower limit (100 ppm for zirconium, 10 ppm for aluminum and copper) of the additive amount of each element.

In contrast to this, as is recognizable from the comparative examples of Table 4, iridium alloys whose additive amount of each element is as small as less than 1 ppm are inferior in workability, have insufficient hardness, and show a remarkable decrease in hardness due to heat treatment. When a total concentration of the additive elements exceeds 1000 ppm, workability remains inferior although hardness is improved.

Note that, pure iridium ingots were manufactured without the addition of the additive elements in order to make a comparison with this embodiment, and the manufacture of fine wires was tried in the same process as with this embodiment. As a result, working was successfully performed anyway until the step of wire rod rough working and the wire rod could be reduced to a wire diameter of 1.0 mm. However, when annealing was thereafter performed at 1000° C. for 30 minutes for wire drawing under heat by electric current application, the resultant was a structure with coarsened crystal grains, and frequently followed by wire breakage in the subsequent working. Thus working into fine wires failed.

Next, fine wires were arbitrarily selected from the above-described embodiments and comparative examples. These fine wirers were cut and the leading ends thereof were worked into probe pins, and the anti-contamination properties were examined by repeated contact. As described earlier, probe pins have the problems of contamination, such as the formation of oxide films on the probe pins themselves due to repeated use and the adherence of foreign substances from objects in contact with the probe pins, and the resistance to contamination has also become an important property.

Figure 2:
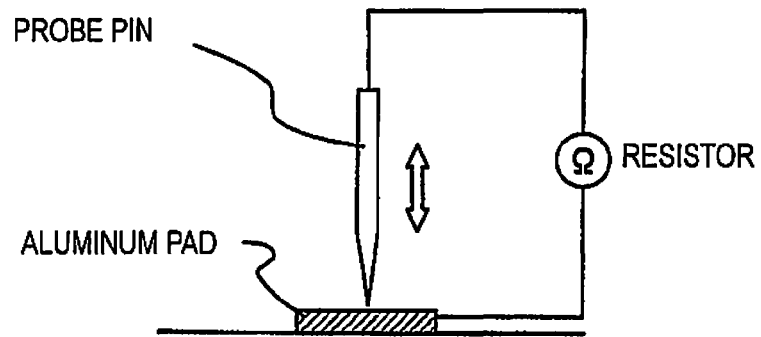
FIG. 2 is a diagram to explain the construction of a simulator for evaluating anti-contamination properties.

The evaluation of the anti-contamination properties was carried out using the simulator shown in FIG. 2. In this test, a probe pin which has been manufactured is set on the simulator and electric resistance is measured by repeated contact under the following conditions. In the test, electric resistance increases with increasing number of contacts. The point in time when electric resistance exceeds 5Ω is regarded as a point in time when cleaning becomes necessary due to the contamination, and the number of contacts until this point in time was measured. The measurement results of the number of contacts occurring until resistance due to contact exceeds 5Ω are shown in Table 5. Note that test results of tungsten, which is a conventional material, are also shown in Table 5.

Test Conditions
Object in contact: Aluminum pad
Contact pressure: 8 g/pin
Applied electric current: 100 mmA/pin

TABLE 5

| | Concentration of additive elements (ppm) | | | Number of contacts*[2] |
|---|---|---|---|---|
| | Al | Cu | Zr | |
| Embodiment 1 | 10 | — | 100 | 1.46 million times |
| Embodiment 3 | — | 10 | 100 | 1.45 million times |
| Embodiment 5 | 10 | 10 | 100 | 1.50 million times |
| Embodiment 6 | 100 | 100 | 100 | 1.51 million times |
| Embodiment 7 | 30 | 10 | 280 | 1.56 million times |
| Embodiment 8 | 45 | 25 | 330 | 1.60 million times |
| Comparative example 1 | 0.5 | — | — | 950,000 times |
| Comparative example 5 | — | 1200 | — | 800,000 times |
| Tungsten | — | — | — | 10,000 times |

*[2]Number of contacts: Number of contacts made until contact resistance exceeded 5 Ω

It was ascertained from Table 5 that in the probe pins made of materials according to each embodiment, the number of contacts made until cleaning becomes necessary becomes not less than 150 times the number of contacts in tungsten, which is a conventional material, and that these probe pins have excellent anti-contamination properties. Although in this respect the effect of the improvement of the anti-contamination properties is observed in comparative examples 1 and 5, it is recognizable that the anti-contamination properties are inferior to those of each embodiment. The high anti-contamination properties of the probe pins according to the present invention were ascertained from the results of the simulation, and these high anti-contamination properties lead to the fact that also in an actual test apparatus, cleaning-less inspection on probe pins (a decrease in the frequency of cleaning) can be achieved and that the total inspection time can be substantially shortened.

INDUSTRIAL APPLICABILITY

As described above, the wire rods for probe pins according to the present invention ensures workability by application of iridium alloys containing additive elements of zirconium, aluminum and copper, aiming at an increase in high-temperature strength, and thus enables fine wire designs and high strength that cannot be achieved with pure iridium. The present invention enables manufacture of probe pins of narrow pitch designs, and further enables maintaining stable properties even in use environments subjected to repeated friction.

The invention claimed is:

1. An iridium alloy suitable for a wire rod for probe pins, said alloy consisting of zirconium as an additive element, aluminum and/or copper as a further additive element, and the balance iridium, wherein the additive element concentration of zirconium is 100 to 500 ppm, and the total additive element concentration of aluminum and/or copper is 10 to 500 ppm.

2. The iridium alloy according to claim 1, wherein the total concentration of additive elements is not more than 600 ppm.

3. A probe pin consisting of an iridium alloy, said alloy consisting of zirconium as an additive element, aluminum and/or copper as a further additive element, and the balance iridium, wherein the additive element concentration of zirconium is 100 to 500 ppm, and the total additive element concentration of aluminum and/or copper is 10 to 500 ppm.

4. A probe pin according to claim 3, wherein the total concentration of additive elements is not more than 600 ppm.

5. A probe pin according to claim 3, having a surface hardness of at least 600 Hv.

6. A probe pin according to claim 5, having a surface hardness of at least 700 Hv.

7. A manufacturing method of a wire rod for probe pins, comprising the steps of:
(a) casting an alloy consisting of zirconium as an additive element, aluminum and/or copper as a further additive element, and the balance iridium, and making a bar by casting the alloy;
(b) forming a wire rod having a wire diameter of 0.5 to 1.0 mm by hot working the bar;
(c) subjecting the wire rod, at least once, to a combination of annealing at 1000 to 1200° C. and wire drawing of not less than one pass under heat by electric current application; and
(d) subjecting the wire rod after wire drawing under heat by electric current application, at least once, to a combination of annealing at 900 to 1200° C. and cold wire drawing of not less than one pass.

8. The manufacturing method according to claim 7 wherein the additive element concentration of zirconium is 100 to 500 ppm, and the total additive element concentration of aluminum and/or copper is 10 to 500 ppm.

9. The manufacturing method according to claim 8 wherein the total concentration of additive elements is not more than 600 ppm.

* * * * *